United States Patent [19]

Hofmann

[11] Patent Number: 4,746,921

[45] Date of Patent: May 24, 1988

[54] BROADBAND SIGNAL SPACE SWITCHING APPARATUS

[75] Inventor: Ruediger Hofmann, Gilching, Fed. Rep. of Germany

[73] Assignee: Siemens Aktiengesellschaft, Berlin and Munich, Fed. Rep. of Germany

[21] Appl. No.: 923,769

[22] Filed: Oct. 27, 1986

[30] Foreign Application Priority Data

Nov. 4, 1985 [DE] Fed. Rep. of Germany ....... 3539101

[51] Int. Cl.[4] .............................................. H04Q 9/00
[52] U.S. Cl. ...................... 340/825.870; 340/825.910; 307/241; 307/576
[58] Field of Search ...................... 340/825.87, 825.91, 340/825.86; 379/292; 370/58, 59, 64; 307/272 A, 241, 481, 576, 585, 571, 473, 475

[56] References Cited

U.S. PATENT DOCUMENTS

| | | | |
|---|---|---|---|
| 3,980,831 | 9/1976 | Mertel | 370/69.1 |
| 4,024,352 | 5/1977 | Mukaemachi et al. | 340/825.91 |
| 4,156,153 | 5/1979 | Szechenyi | 379/292 |
| 4,217,502 | 8/1980 | Suzuki et al. | 307/473 |
| 4,417,245 | 11/1983 | Melas et al. | 340/825.91 |
| 4,568,842 | 2/1986 | Koike | 307/272 A |

Primary Examiner—Donald J. Yusko
Attorney, Agent, or Firm—Hill, Van Santen, Steadman & Simpson

[57] ABSTRACT

In a broadband signal space switching apparatus, respective switching elements are controlled by respective decoder-controlled, crosspoint-associated memory cell and are respectively formed with a CMOS NOR gate and a CMOS NAND gate, each of which has a respective input connected to the appertaining signal input line and another respective input connected to the output or, respectively, to the complementary output of the memory cell. The two inputs of a CMOS push-pull output circuit are connected to the output of the CMOS NAND gate and to the output of the CMOS NOR gate, the output of the CMOS push-pull output circuit forming the output of the switching element. The two source electrodes of the CMOS push-pull output circuit are fed by two feed voltage sources corresponding to the CMOS logic levels.

1 Claim, 2 Drawing Sheets

BROADBAND SIGNAL SPACE SWITCHING APPARATUS

BACKGROUND OF THE INVENTION

1. Field of the Invention

The present invention relates to broadband signal space switching apparatus and is particularly concerned with switching elements which are controlled by decoder-controlled, crosspoint-associated memory cells.

2. Description of the Prior Art

Recent developments in telecommunications technology have led to service-integrated communications transmission and switching systems for narrowband and broadband communications services which provide light waveguides as the transmission media in the area of the subscriber lines by way of which both the narrow band communications services such as, in particular, 64 kbit/s digital telephony, as well as broadband communications services such as, in particular, 140 Mbit/s picture telephony are conducted, whereby, however, narrowband signal switching devices and broadband signal switching devices (preferably having shared control devices) are provided in juxtaposition in the switching stations (German Pat. No. 24 21 002).

It is known in the context of a broadband signal time-division multiplex switching device whose crosspoints are respectively used in time-division multiplex for a plurality of connections to connect two respective lines with the assistance of a gate which is switched on and off by a crosspoint-associated memory cell constructed as a bistable D flip-flop. The crosspoint-associated memory cell has a clock input which is supplied with a corresponding clock signal and is driven in only one coordinate direction, namely at its D input (Pfannschmidt, "Arbeitsgeschwindigkeitsgrenzen von Koppelnetzwerken für Breitband-Digitalsignale", Dissertation, Braunschweig 1978, FIG. 6.7). In view of a time-division multiplex factor of about 4–8 which is attainable given a bit rate of 140 Mbit/s and in view of complex circuit technology thereby required, however, pure space switching devices are presently preferred for switching broadband signals, the connections established via the individual crosspoints being only spacial separated from one another.

A pure broadband signal space switching arrangement can be constructed as a crosspoint matrix in whose crosspoints the switching elements are respectively controlled by a crosspoint-associated holding memory cell that is merely decoder controlled (Pfannschmidt, op. ct., FIG. 6.4). The switching elements can be respectively constructed as complementary metal-oxide-semiconductor (CMOS) transfer gates (CMOS transmission gates) (ISS'84 Conference Papers 23C1, FIG. 9). The use of a simple CMOS transfer gate as a switching element, however, involves a load of its input line by the capacitance of its output line in the conductive condition of the CMOS transfer gate, and this condition can cause signal delays. As a result of what are referred to as under-threshold effects (for example, in the form of stray currents or under-threshold currents) along the MOS transistors, however, cross-talk phenomena can occur at switching elements that are actually located in inhibited condition.

A similar case also is true of a broadband space switching device comprising crosspoints having switching elements respectively controllable by a crosspoint-associated memory cell, the switching elements being respectively constructed with a CMOS inverter circuit comprising MOS transistors of the enhancement type which has its input side connected to the appertaining signal input line and its output side connected to the appertaining signal output line, a p-channel depletion transistor having its control electrode connected to the output of a memory cell being connected between the p-channel enhancement transistor and the appertaining feed voltage source and an n-channel depletion transistor having its control electrode connected to the complementary output of the memory cell being inserted between the n-channel enhancement transistor thereof and the appertaining feed voltage source (ISS'84 Conference Papers 31C3, FIG. 14). As a consequence of a constant, at least weak conductivity of the two depletion transistors, such an execution of the switching elements leads to static dissipated power of the crosspoint, even in its inhibit condition, and also leads to the fact that a switching element which is in the conductive condition, is also loaded by switching elements which were in the inhibited condition and which are nonetheless weakly conductive. Furthermore, no full signal swings between the two values of feed potential are possible.

SUMMARY OF THE INVENTION

It is therefore the object of the present invention to provide, in a broadband space switching device, a particularly advantageous construction of the switching elements wherein the disadvantages set forth above are avoided.

According to the present invention, the same relates to a broadband space switching apparatus having crosspoints with respective switching elements controllable by a decoder-controlled, crosspoint-associated memory cell, the broadband space switching apparatus being particularly characterized in that the switching elements are respectively formed:

With a CMOS NOR gate fed by two feed voltage sources corresponding to the CMOS logic levels and having its one input connected to the appertaining signal input line and its other input connected to an output of the memory cell;

With a CMOS NAND gate likewise fed by the two feed voltage sources corresponding to the CMOS logic levels and likewise having its one input connected to the appertaining signal input line and its other input connected to the complementary output of the memory cell;

With a CMOS push-pull output circuit leading to the appertaining signal output line which has the control electrode of its one MOS transistor connected to the output of the CMOS NAND gate and has the control electrode of its other MOS transistor connected to the output of the CMOS NOR gate, and the circuit, just as with the CMOS NAND gate and the CMOS NOR gate having its two source electrodes supplied by the two feed voltage sources corresponding to the CMOS logic levels.

It should be pointed out here that a CMOS/TTL (transistor-transistor logic) converter capable of three output states, known from U.S. Pat. No. 4,217,502, fully incorporated herein by this reference, comprises:

A CMOS NOR gate fed by two feed voltage sources corresponding to the CMOS logic levels having its one input connected to the converter input line and its other input charged with a control signal;

A CMOS NAND gate likewise fed by the two feed voltage sources corresponding to the CMOS logic levels and likewise having its one input connected to the converter input line and its other input charged with a negated control signal; and A CMOS push-pull output circuit leading to the appertaining signal output line which has the control electrode of its one CMOS transistor connected to the output of the CMOS NAND gate and the control electrode of its other CMOS transistor connected to the output of the CMOS NOR gate, whereby the two source electrodes of the latter are fed by two feed voltage sources corresponding to the TTL logic levels.

Although problems of a particularly advantageous construction of the switching elements of a broadband switching device are not touched upon therein, the present disclosure teaches the manner of achieving the same. In addition to the advantage of a complete decoupling of output and input lines and the consequent elimination of crosstalk problems, as well as avoidance of dissipated power in switching elements which are in the inhibited condition, the present invention provides the further advantage of high working speed since, first of all, reactions of the output line capacitance onto the input line are avoided, and, second, the inverter circuit, acting as a driver buffer for the output line, noticeably increases the edge steepness of the through-connected signal. At the same time, the signals can be through-connected with the full swing between the two values of feed potential.

BRIEF DESCRIPTION OF THE DRAWINGS

Other objects, features and advantages of the invention, its organization, construction and operation will be best understood from the following detailed description, taken in conjunction with the accompanying drawings on which.

DESCRIPTION OF THE PREFERRED EMBODIMENTS

Figure 1:
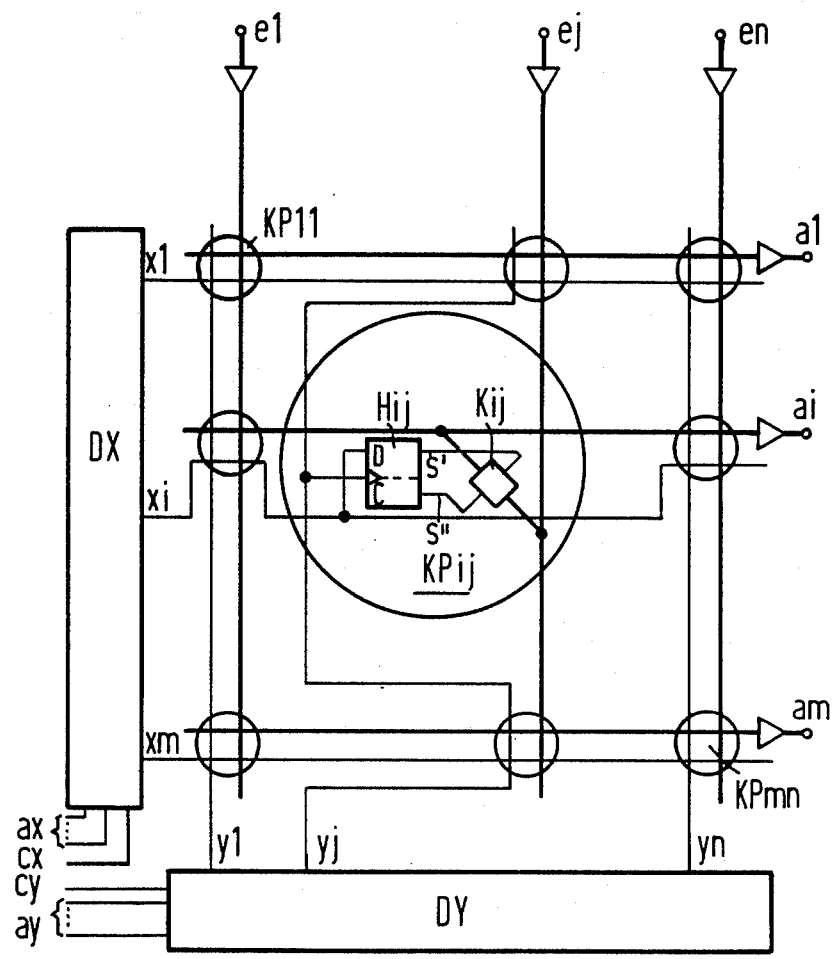
FIG. 1 is a schematic diagram illustrating an exemplary embodiment of a broadband switching matrix network.

FIG. 1 on the drawings schematically outlines a broadband signal space switching device in the scope necessary for an understanding of the invention. The space switching device comprises a crosspoint matrix having crosspoints KPll ... KPij ... KPmn whose switching elements are respectively controlled by a crosspoint-associated holding memory cell Hij (at the crosspoint KPij, as indicated in greater detail at the crosspoint KPij for the switching element Kij thereof. The holding memory cell Hij (at the crosspoint KPij) is formed by a bistable D flip-flop whose two outputs s' and s" are connected to corresponding control inputs of the respective switching element (Kij in the case of the crosspoint KPij).

The holding memory cells Hij are in turn selected in two coordinate directions by two selection decoders, in particular, a row decoder DX and a column decoder DY via corresponding selection lines xl ... xi ... xm; yl ... yj ... yn. The decoder DX selects in the row direction and thereby has its perspective decoder outputs .. . xi ... connected to the D-inputs D of the D-flip-flops ... Hij ... arranged in the appertaining matrix row, herein the $i^{th}$ row, whereas the decoder DY selects in the column direction and has its respective decoder outputs ... yj ... connected to the clock inputs C of the D flip-flops ... Hij ... arranged in the appertaining matrix column, for example, in the $j^{th}$ column.

As may be seen from FIG. 1, the two selection decoders DX, DY are chargeable via input lines ax, ay with a respective crosspoint row or crosspoint column address shared by a matrix line (row or column) of crosspoints and chargeable via input lines cx, cy with a respective address clock signal in response to which they respectively emit a selection signal in due time to the selection line corresponding to the respective crosspoint line address.

The coincidence of a row selection signal and of a column selection signal at the intersection of the appertaining matrix row with the appertaining matrix column in the establishment of a corresponding connection then effects an activation of the holding memory cell located at that crosspoint, for example, the holding memory cell Hij with the result that the switching element Kij in this example, which is controlled by the appertaining holding memory cell Hij, becomes conductive.

In order for the switching element Kij considered in the present example to be inhibited, in turn, given a clear down of the appertaining connection, the emission of only a corresponding column selection signal by the column decoder DY via its selection line ij suffices, without the row decoder DX emitting a selection signal via its row selection line xi. The control signal then appearing only at the clock input C of the holding memory cell Hij belonging to the crosspoint KPij then effects the resetting of the holding memory cell Hij, with the result that the switching element Kij controlled thereby is inhibited.

At the one output s', it is assumed that the individual holding memory cells Hij respectively output a signal $U_{DD}$ corresponding to the one feed potential $U_{DD}$ ($+5$ V) of CMOS circuits or a signal $U_{SS}$ corresponding to the other feed potential $U_{SS}$ (ground) of CMOS circuits and that they emit the respective other signal $U_{SS}$ or $U_{DD}$ at their output s". Further details of the circuit-oriented construction of the holding memory cells Hij will not be discussed in further detail herein since the same is not considered necessary for an understanding of the invention. Such details, however, have already been disclosed in the art, such as in the German patent application P 35 33 915.2.

Figure 2:
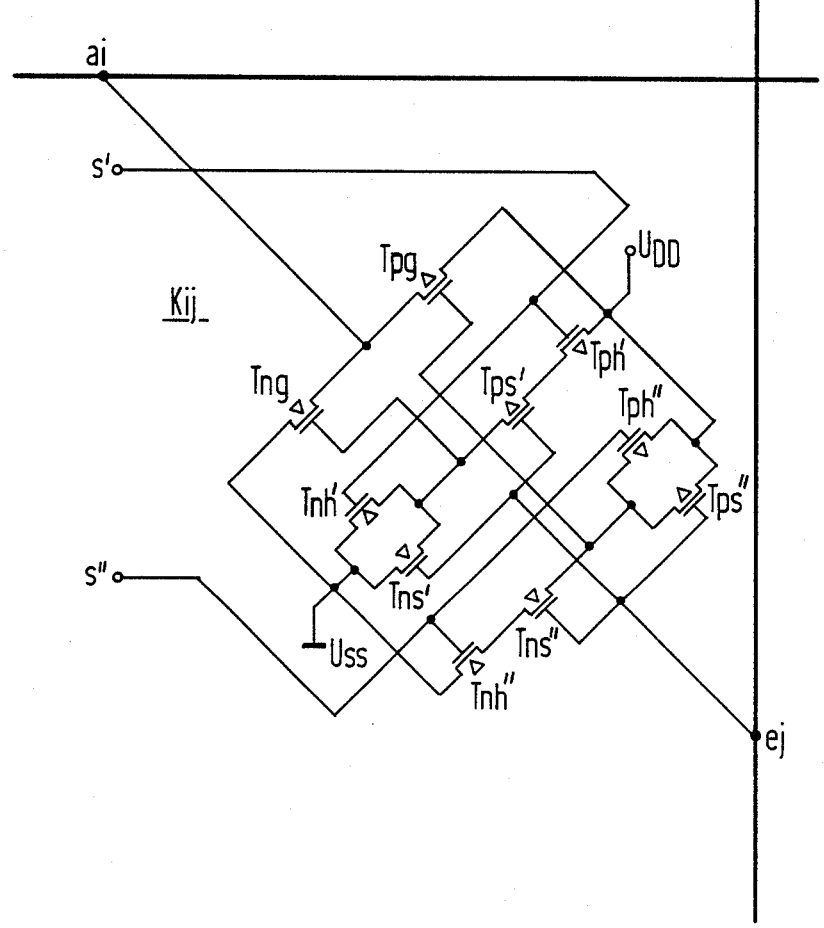
FIG. 2 is a schematic circuit diagram of the circuit-oriented construction of the crosspoints of the embodiment illustrated in FIG. 1 in accordance with the present invention.

Details of the circuit-oriented construction of the switching elements Kij may be seen from FIG. 2. In accordance with FIG. 2, a switching element Kij is formed with a CMOS NOR gate Tps', Tph', Tns', Tnh' fed by two feed voltage sources $U_{DD}$, $R_{SS}$ corresponding to the CMOS logic levels and having its one input connected to the appertaining switching matrix line ej and its other input connected to the output s' of the memory cell Hij. The circuit further comprises a CMOS NAND gate Tps", Tph", Tns", Tnh" likewise fed by the two feed voltage sources $U_{DD}$, $U_{SS}$ corresponding to the CMOS logic levels and likewise having its one input connected to the appertaining switching matrix input line ej and its other input connected to the complementary output s" of the memory cell Hij. The control electrode of the one MOS transistor Tpg of a CMOS push-pull output circuit Tpg, Tng leading to the appertaining switching matrix output line ai is connected to the output of the CMOS NAND gate Tps", Tph", Tns", Tnh", and the control electrode of the other MOS transistor Tng of the CMOS push-pull output circuit Tpg, Tng is connected to the output of the CMOS NOR gate Tps', Tph', Tns', Tnh' and, just like the CMOS NAND gate Tps", Tph", Tns", Tnh" and the CMOS NOR gate Tps', Tph', Tns', Tnh', the two source electrodes of the CMOS push-pull output circuit Tpg, Tng are fed by the two feed voltage sources $U_{DD}$, $U_{SS}$ corresponding to the CMOS logic levels.

When, proceeding from the holding memory cell Hij (FIG. 1), the potential $U_{SS}$ is connected to the control input s' of the switching element Kij and the potential $U_{DD}$ is connected to the control input s", the switching element Kij is then in its conductive condition. Digital signals appearing at the input ej therefore proceed to the output ai, amplified in the CMOS push-pull output circuit Tpg, Tng, whereby a reaction from the output ai onto the input ej is suppressed by the switching element Kij at the same time.

When, proceeding from the holding memory cell Hij (in FIG. 1), the potential $U_{DD}$ is applied to the control input s' of the switching element Kij and the potential $U_{SS}$ is applied to the control input s", then the switching element Kij is in its inhibited (tri-state) condition, so that no signals appearing at the input ej proceed to the outputs ai. The inhibited switching elements of the crosspoint matrix KPll ... KPij ... KPmn (FIG. 1) thereby simultaneously suppress cross-talk effects between the output lines al ... ai ... am (FIG. 1) and the input lines el ... ej ... en (FIG. 1) via inhibited crosspoints of the space switching apparatus.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a broadband signal space switching device of the type in which a matrix of signal input lines and signal output lines form crosspoints, in which a respective switching element is connected to the signal input line and the signal output line of a respective crosspoint, the switching elements of said crosspoints being controllable by decoder-controlled crosspoint-associated memory elements which have first and second outputs, the improvement wherein each of said switching elements comprises:

a complementary metal-oxide-semiconductor (CMOS) NOR gate connected across first and second CMOS voltage sources which correspond to CMOS voltage levels, and including a first signal input connected to the respective signal input line, and a second signal input connected to an output of the respective crosspoint-associated memory cell;

a CMOS NAND gate connected across said CMOS voltage sources and including a first input connected to said signal input line and a second input connected to a complementary output of said memory cell; and a CMOS push-pull output circuit including an output connected to the respective signal output line, the control electrode of its one CMOS transistor connected to the output of said CMOS NAND gate and the second control electrode of the other transistor connected to the output of said CMOS NOR gate, said CMOS push-pull output circuit connected across said first and second CMOS voltage sources.

* * * * *